United States Patent [19]
Shimada et al.

[11] Patent Number: 5,182,620
[45] Date of Patent: Jan. 26, 1993

[54] ACTIVE MATRIX DISPLAY DEVICE

[75] Inventors: Takayuki Shimada, Nara; Yasuhiro Matsushima, Kashihara; Yutaka Takafuji, Nara, all of Japan

[73] Assignee: Sharp Kabushiki Kaisha, Japan

[21] Appl. No.: 678,077

[22] Filed: Apr. 2, 1991

[30] Foreign Application Priority Data

Apr. 5, 1990 [JP] Japan ................................ 2-90963

[51] Int. Cl.⁵ ............................................. H01L 27/01
[52] U.S. Cl. ........................................ 257/72; 359/59; 359/87
[58] Field of Search ................. 357/23.7, 30 H, 4, 54; 359/59, 87, 54, 57, 88

[56] References Cited

U.S. PATENT DOCUMENTS

| | | | |
|---|---|---|---|
| 4,470,060 | 9/1984 | Yamazaki | 357/23.4 |
| 4,839,707 | 6/1989 | Shields | 357/23.7 |
| 5,032,883 | 7/1991 | Wakai et al. | 357/23.7 |
| 5,042,918 | 8/1991 | Suzuki | 357/23.7 |

FOREIGN PATENT DOCUMENTS 58-172685 10/1983 Japan .

OTHER PUBLICATIONS

N. J. Koda et al, Japanese Patent Publication No. 56-39477, published Sep. 12, 1981.
T. Shimada et al., Japanese Laid-open Patent Publication No. 1-304402 1990.

Primary Examiner—Andrew J. James
Assistant Examiner—Courtney A. Bowers
Attorney, Agent, or Firm—Nixon & Vanderhye

[57] ABSTRACT

An active matrix display includes pixel electrodes (4) which are formed over an insulating layer (17). The insulating layer (17) covers signal lines (2) which supply an image signal and also connect one pixel electrode (4) with another. The insulating layer (17) also covers an additional capacitor common line (8). The pixel electrodes (4) at least partially overlay the signal lines (2) and the additional capacitor common line (8), thereby achieving a larger numerical aperture for the display.

7 Claims, 5 Drawing Sheets

ACTIVE MATRIX DISPLAY DEVICE

RELATED APPLICATIONS

This application is related to our commonly assigned U.S. patent application Ser. No. 07/615,949 filed Nov. 20, 1990 entitled "An Active Matrix Display Device" and naming Shimada et al as inventors. Said prior application is hereby incorporated by reference.

BACKGROUND OF THE INVENTION

1. Field of the Invention

The present invention relates to an active matrix display device, and more particularly to an active matrix display device employing a switching device such as a thin film transistor (hereinafter called "TFT"), and using liquid crystal for a display medium.

2. Description of the Prior Art

Recently, research on active matrix display devices using liquid crystals for a display medium is keenly in progress, among which special attention is focused on the development of liquid crystal display devices (hereinafter called "LCD") so as to find applications in planar display devices. Such research is producing successful models. At present the research on active matrix LCDs are divided into at least two types depending upon the objects: one is to achieve a large display screen usable for a wall-hung TV display, and the other is to achieve a high-precision display screen. A high-precision, small-size display screen is particularly in strong demand so as to achieve a color view finder for video cameras.

The active matrix LCD is provided with IC chips for driving a TFT array. In high-precision, small-size active matrix LCDs the terminals are provided at such small distances so as to make it difficult to mount IC chips thereon. To overcome this difficulty, a TFT array is formed on the substrate for constituting a driving circuit.

Referring to FIG. 4, a basic structure of an active matrix display device using a driving circuit and a TFT array both formed on the same substrate will be described. On a substrate 50 are disposed a gate driving circuit 54, a source driving circuit 55, and a TFT array section 53 in which multiple gate buses 51 in parallel extend from the gate driving circuit 54. Multiple source buses 52 from the source driving circuit 55 cross the gate buses 51 at right angles. In parallel with the source bus 52, an additional capacitor common line 59 is disposed.

A rectangular region enclosed by the source buses 52, the gate buses 51 and the additional capacitor common line 59 includes the TFT 56, pixels 57 and additional capacitors 58. The gate electrode of the TFT 56 is connected to the gate bus 51, and the source electrode is connected to the source bus 52. Liquid crystal is confined in between the pixel electrode connected to the drain electrode of the TFT 56 and the counter electrode on the substrate so as to constitute pixels 57. An additional capacitor 58 is disposed between the TFT 56 and the additional capacitor common line 59. The additional capacitor common line 59 is connected to an electrode having the same potential as that of the counter electrode.

In this type of display the gate driving circuit 54 generates a signal in response to which the TFT 56 connected to the gate bus 51 is turned on. The source driving circuit 55 sends an image signal to the pixels 57 through the source bus 52. After the TFT 56 is off, the image signal is retained between the pixel electrodes and the counter electrode. Since a high-precision, small-size active matrix LCD has pixels having a reduced area, the capacitance between the pixel electrodes and the counter electrodes becomes small. As a result, the image signal cannot be retained for a required period of time. In addition, the potential of the bus varies in large amplitude, thereby failing to match with the potential of the pixel electrode. To make up for the insufficient capacitance, the additional capacitors 58 are provided in parallel with the pixels 57. One of the terminals of each capacitor 58 is connected to the drain electrode of the TFT 56, and the other terminal is connected to an electrode having the same potential as that of the counter electrode through the additional capacitor common line 59 so as to equalize the potentials between the other terminal of the TFT 56 and the counter electrode.

The active matrix display devices incorporating the driving circuit as a unit uses polysilicon for a semiconductor layer of the TFT because of the high degree of mobility of electrons and holes, and of the possibility of fabricating n-type TFTs and p-type TFTs, thereby making it possible to constitute a CMOS construction.

This type of active matrix display device is disadvantageous in that the provision of additional capacitors reduces the effective area for the pixel electrodes, thereby lowering the numerical aperture of the display panel as a whole. In order to solve the problem of the reduced numerical aperture, and avoid the occurrence of delayed signals, Japanese Laid-Open Patent Publication No. 1-304402 proposes an active matrix display device, which includes an additional capacitor common line.

Referring to FIGS. 5 and 6, this known display device will be described to explain the background of the present invention:

A polysilicon layer is formed on a glass substrate 11 by a known method such as a CVD method and a sputtering method. The resulting polysilicone layer is patterned so as to form a semiconductor layer 12 and a lower capacitor electrode 5. Then a gate insulating layer 13 is formed by a CVD method or by thermally oxidizing the surface of the polysilicon layer. The lower capacitor electrode 5 is subjected to doping by an ion implantation method so as to make it a low resistance capacitor electrode.

The gate bus 1, the gate electrodes 3a and 3b, and upper capacitor electrode 6 are formed with n-type or p-type polysilicon. The additional capacitor 27 is formed between the upper capacitor electrode 6 and the lower capacitor electrode 5. Under the mask of the gate electrodes 3a and 3b, and a resist formed by photolithography, lower parts below the gate electrodes 3a and 3b of the semiconductor layer 12 are subjected to ion implantation. In this way the source and drain region of the TFT is formed as a self-alignment structure.

An insulating layer 14 is formed on the whole surface of the substrate 11.

Referring now to FIG. 5, three contact holes 7a, 7b and 7c are formed. The contact holes 7a and 7b extend through the insulating layer 14 and the gate insulating layer 13, and are open on the semiconductor layer 12 and the lower capacitor electrode 5.

Next, the source bus 2 and the additional capacitor common line 8 are simultaneously formed with a low-resistance metal such as aluminum. As shown in FIG. 5, the source bus 2 is formed such that it expands on the contact hole 7a, and the additional capacitor common line 8 is formed such that it expands on the contact hole 7c. The source bus 2 is connected to the semiconductor layer 12 through the contact hole 7a, and the additional capacitor common line 8 is connected to the upper capacitor electrode 6 through the contact hole 7c. The additional capacitor common line 8 is connected to an electrode having the same potential as that of the counter electrode on the counter substrate.

FIG. 5 further illustrates that a pixel electrode 4 of Indium Tin Oxide (ITO) is patterned. Part of the pixel electrode 4 extends through the contact hole 7b, thereby connecting the pixel electrode 4 to the semiconductor layer 12 through the contact hole 7b. The whole surface of the substrate 11 is covered with a protective layer 15.

The additional capacitor 27 has a thin gate insulating layer 13 between the upper capacitor electrode 6 and the lower capacitor electrode 5, thereby increasing the capacitance of the additional capacitor 27 per unit area. Thus, the area occupied by the additional capacitor 27 is advantageously minimized, thereby preventing the numerical aperture of the display panel from being reduced.

In order to enhance the high-precision display, it is necessary to minimize the size of the pixel electrodes. However, if the size of the pixel electrodes is reduced beyond a particular limit, the spacing of the gate bus 1 and the source bus 2, the size of the TFT 25a and 25b cannot be shortened any more. As a result, the numerical aperture of the display panel becomes low, thereby resulting in a dark image picture.

The brightness of the image picture on the display screen is not always proportional to the area of the pixel electrodes 4. The liquid crystal layer positioning on the pixel electrodes 4 unavoidably has an electric field whose intensity depends upon the degree of display, and the molecules therein are orientated by the electric field, but the liquid crystal positioning off the pixel electrodes 4 has no electric field, so that the molecules are in disorder. In the twisted nematic mode that is currently in most common use, the normal-white system is used because it is least liable to birefringent when an image picture is represented white. Under the normal-white system the "white" representation occurs in other area having no electric field than the pixel electrodes 4. As a result, the contrast ratio decreases. In order to prevent reduction in the contrast ratio, a light shield layer is formed in other areas than the parts on the counter substrate corresponding to the pixel electrodes. The light shield layer is in principle effective to prevent the contrast ratio from decreasing but the actuality is that the numerical aperture of the display panel is nevertheless reduced because of the overlapping of the edges of the light shield layer and the peripheral edge of the pixel electrode.

It will be understood from the foregoing description that the known high-precision, small-size active matrix display device reduces the display performance because of the low numerical aperture. When a display device having a large area covered by the light shield layer is used for a projection type display device, another problem arises as black spots in the image picture resulting from the light shield layers.

SUMMARY OF THE INVENTION

The active matrix display device of this invention, which overcomes the above-discussed and numerous other disadvantages and deficiencies of the prior art, comprises a first insulated substrate and a second insulated substrate, pixel electrodes arranged in matrix on an inner side of the first insulated substrate, signal lines for supplying an image signal, the signal line connecting one pixel electrode to another, wherein the signal line is covered with an insulating layer, and the pixel electrodes are formed on the insulating layers.

In a preferred embodiment, the parts of the pixel electrodes overlay parts of the signal lines through the insulating layers.

According to another aspect of the present invention, the active matrix display device comprises a pair of insulating substrates, pixel electrodes arranged in matrix on an inner side of one of the substrates, signal lines for supplying an image signal, the signal line connecting one pixel electrode to another, an additional capacitor for retaining the electric charge of the pixel electrode, an additional capacitor common line connected to one electrode of the additional capacitor, wherein the signal line is covered with an insulating layer, and the pixel electrodes are formed on the insulating layers, and wherein parts of the pixel electrodes overlay parts of the additional capacitor common lines.

In a preferred embodiment, the first insulated substrate comprises a stagger type thin film transistor including a semiconductor layer, a gate insulating layer, and a gate electrode formed thereon, the thin film transistor having a source electrode connected to the signal line, and a drain electrode connected to the pixel electrodes.

Thus, the present invention described herein makes possible of the objective of providing an active matrix display device capable of reproducing a high-precision image picture on the display by using pixel electrodes having a relatively large area and a large numerical aperture.

In the known display device, because of having no insulating layer between the signal line and the pixel electrodes or between the additional capacitor common line and the pixel electrodes, it is required that the signal line and the pixel electrodes, and the additional capacitor common line and the pixel electrodes must be arranged so as not to overlap each other. In contrast, in the present invention the signal line or the additional capacitor common line or both are wholly covered with an insulating layer on which the pixel electrodes are formed. Thus, it is not necessary to take into consideration any tolerance in forming the pixel electrodes by patterning, thereby securing a relatively large area of the pixel electrodes. The large area of pixel electrode has a large numerical aperture. In addition, the present invention ensures that no leakage of light occurs between the signal lines and the pixel electrodes or between the additional capacitor common lines and the pixel electrodes, thereby eliminating the necessity of providing light shield layers in these interface areas. This also increases the numerical aperture of the display panel.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
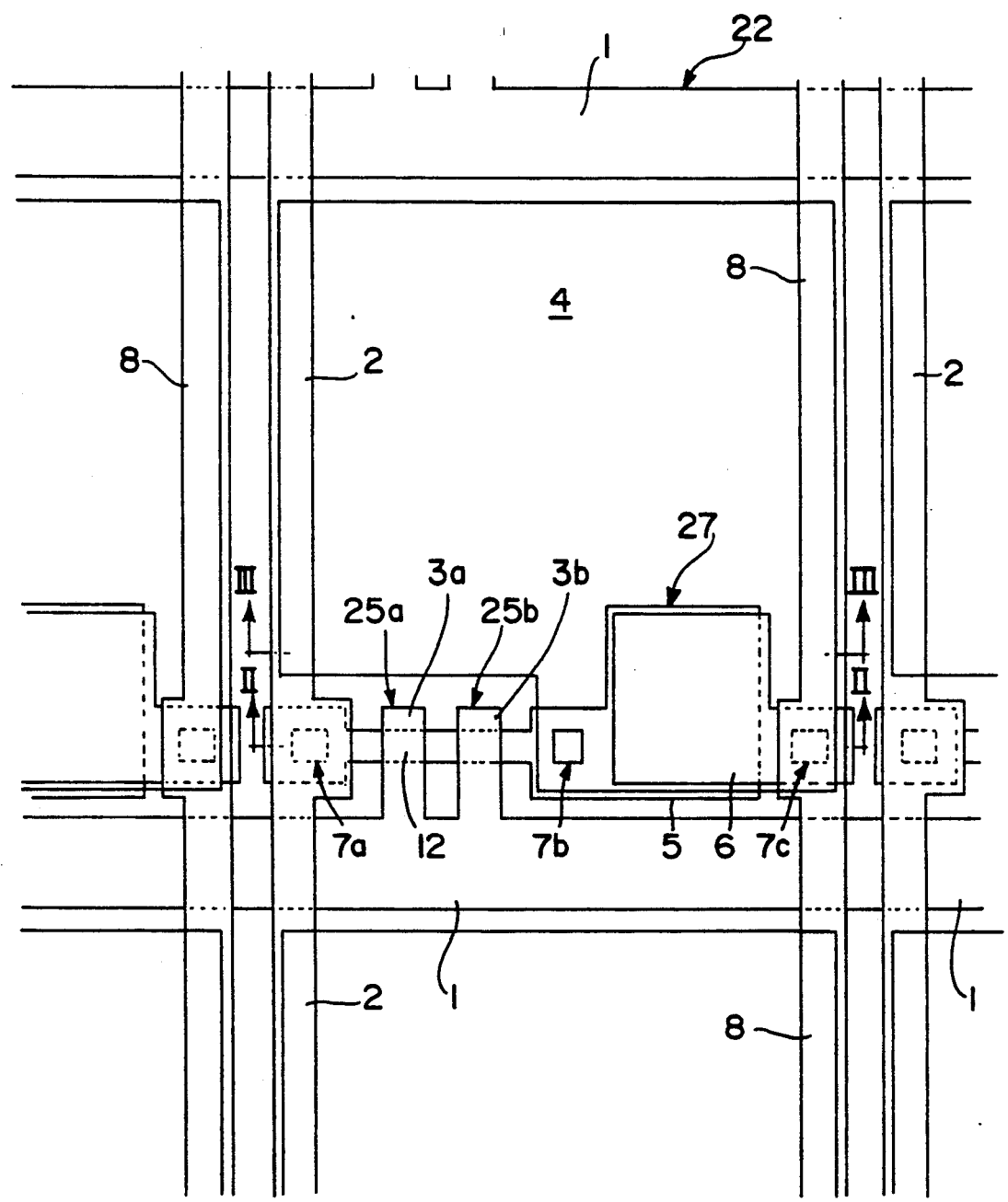
FIG. 1 is a plan view showing a TFT array in an active matrix substrate employed in an active matrix display device according to the present invention.
Figure 2:
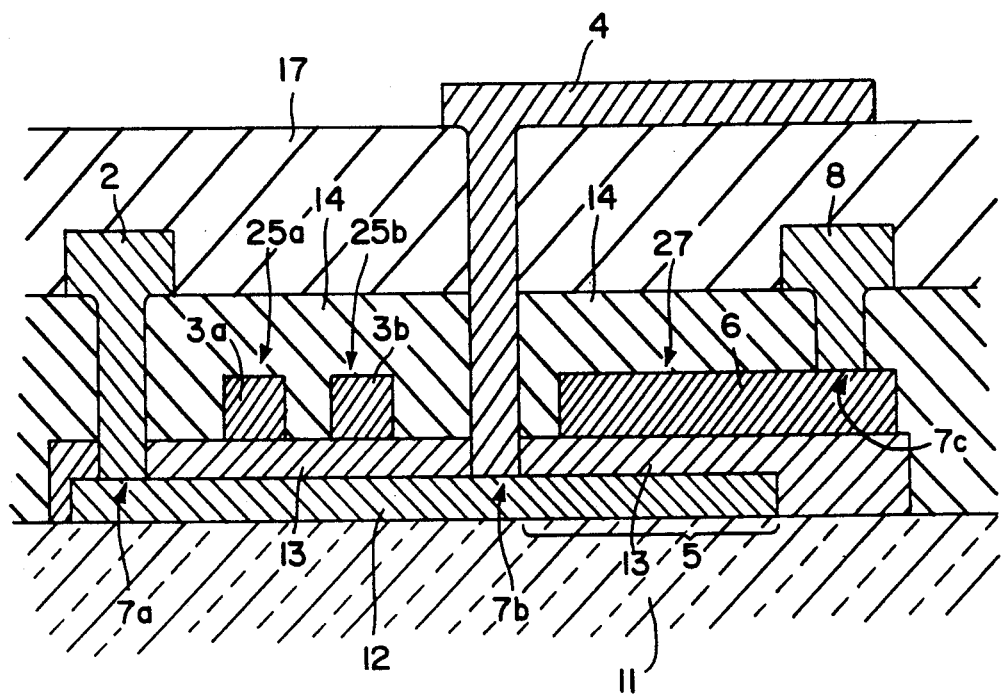
FIG. 2 is a cross-sectional view taken along the line II—II in FIG. 1.
Figure 3:
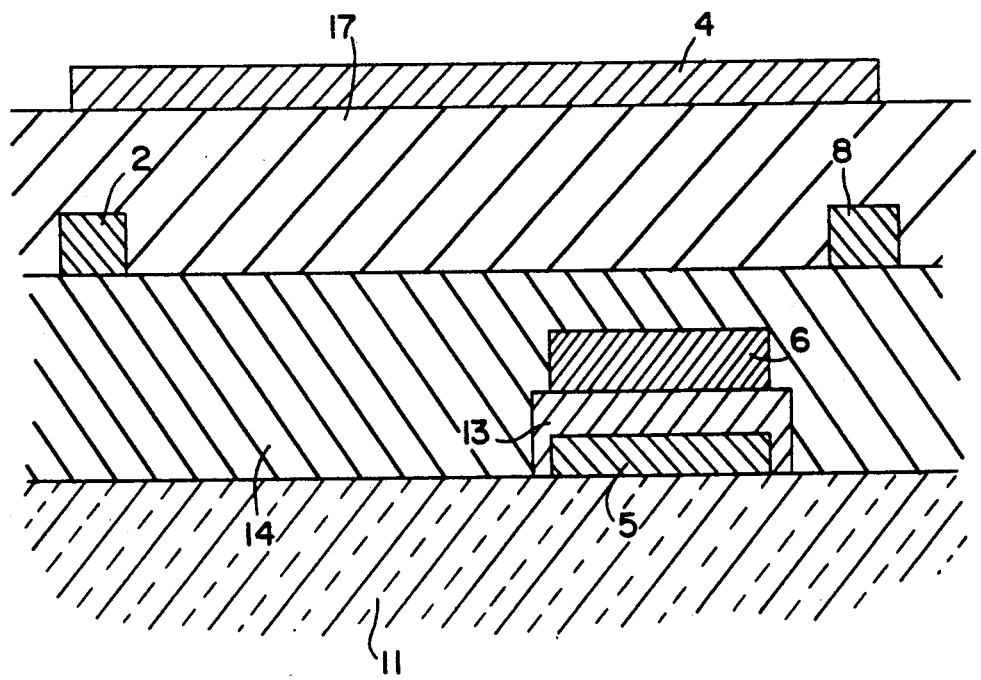
FIG. 3 is a cross-sectional view taken along the line III—III in FIG. 1.
Figure 4:
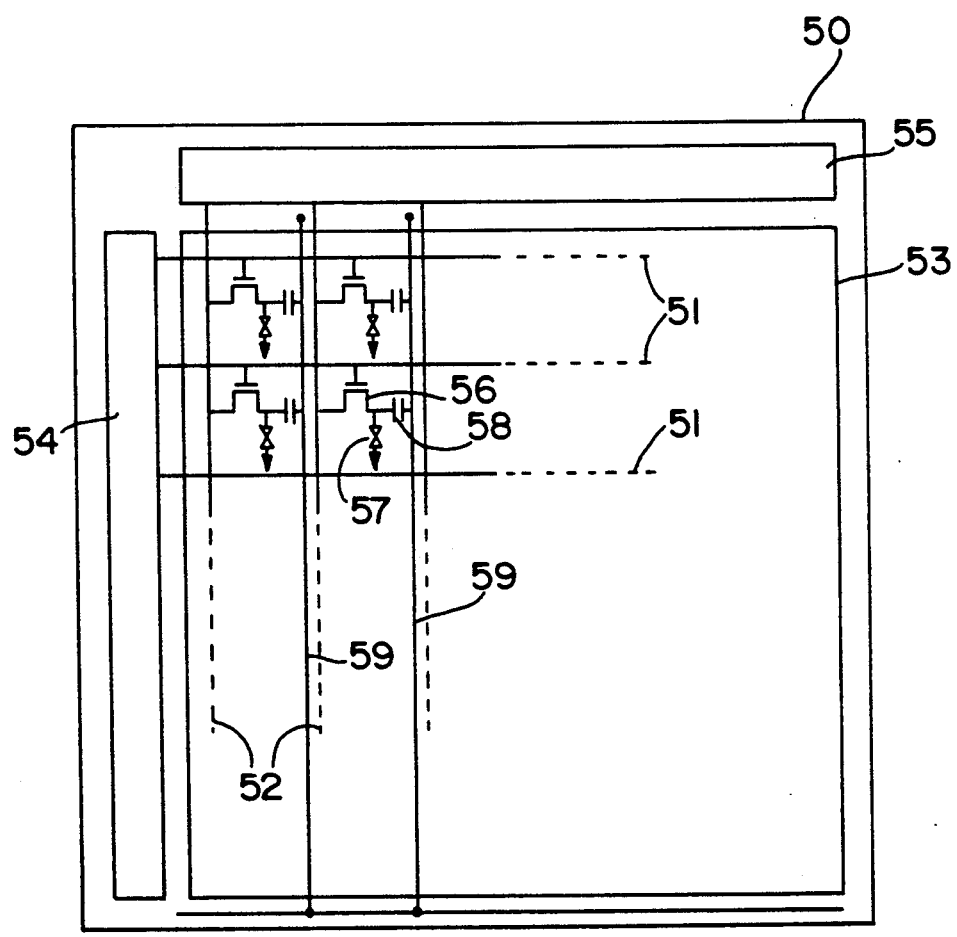
FIG. 4 is a diagrammatic view showing a known active matrix display device.

Referring to FIGS. 1 to 3, an active matrix display device according to the present invention will be described in the order of the steps taken to fabricate it:

The whole surface of a transmissive insulating substrate 11 such as quartz and glass was covered with a polysilicon thin layer by a CVD method. The polysilicon thin layer is used to make a semiconductor layer 12 and a lower capacitor electrode 5 at a later stage. A stagger type TFT was used. Then, an insulating layer was formed by a CVD method, but it can be done by other methods such as by sputtering or by thermally oxidizing the surface of the polysilicon thin layer. The insulating layer is used to make a gate insulating layer 13 at a later stage. The gate insulating layer 13 was approximately 100 nm thick.

Next, the semiconductor layer 12 and the lower capacitor electrode 5 were patterned into the shape shown in FIG. 1. Alternatively, the gate insulating layer 13 can be formed after the semiconductor layer 12 and the lower capacitor electrode 5 are patterned into the desired shapes. It is possible to anneal it by laser or anneal it in a nitrogen atmosphere before the formation of the insulating layer, so as to enhance the crystallization of the polysilicon layer. Then, ion was implanted in the lower capacitor electrode 5 so as to make it a low resistance lower capacitor electrode.

Then, the gate bus 1, the gate electrode 3a and 3b, and the upper capacitor electrode 6 were formed. At first, a polysilicon thin layer was formed by a CVD method, and subjected to doping. The polysilicon thin layer was patterned into the shapes shown in FIG. 1. An additional capacitor 27 was formed between the upper capacitor electrode 6 and the lower capacitor electrode 5. The gate electrodes 3a and 3b, and a resist formed by photolithography were used as a mask, and under this mask ion was implanted in the parts of the semiconductor layer 12 lower than the gate electrodes 3a and 3b. In this way the source drain regions of the TFTs 25a and 25b were formed.

The whole surface of the substrate 11 was covered with an insulating layer 14 by a CVD method, in the form of a silicon oxidized film or a silicon nitride film either having a thickness of 700 nm. Then, as shown in FIG. 1 two contact holes 7a and 7c were formed. The addition of impurity to the silicone oxidized film facilitates the flattening of the top surface of the insulating layer 14 at about 1000° C. The flat surface of the insulating layer 14 prevents the wires formed thereon from being broken. As shown in FIG. 2, the contact hole 7a extended through the insulating layer 14 and the gate insulating layer 13, and is open on the semiconductor layer 12. The contact hole 7c extended through the insulating layer 14 and is open on an end portion of the upper capacitor electrode 6.

Then, the source bus 2 functioning as a signal line, and the additional capacitor common line 8 were simultaneously formed by using a low resistance metal such as aluminum. As shown in FIG. 1, the source bus 2 was passed through the contact hole 7a and expanded in the opening thereof. The additional capacitor common line 8 was passed through the contact hole 7c and expanded in the opening thereof. In this way the source bus 2 was connected to the semiconductor layer 12 through the contact hole 7a. The additional capacitor common line 8 was connected to the upper capacitor electrode 6 through the contact hole 7c. After the display device was finished, the additional capacitor common line 8 was connected to an electrode having the same potential as that of the counter electrode on the counter substrate.

Then, the silicon oxidizing film or silicon nitride film was formed on the whole surface of the substrate 11 by a CVD method, so as to form an intermediate insulating layer 17 in which a contact hole 7b was formed. As shown in FIG. 2, the contact hole 7b extended through the intermediate insulating layer 17, the insulating layer 14 and the gate insulating layer 13 and was open on the semiconductor layer 12 and the lower capacitor electrode 5.

A pixel electrode 4 was formed with ITO by patterning. As shown in FIG. 1, the pixel electrode 4 was formed so as to overlay the source bus 2 and the additional capacitor common line 8 and the contact hole 7b and 7c, and the additional capacitor 27. The pixel electrode 4 was connected to the semiconductor layer 12 through the contact hole 7b.

In the illustrated embodiment, the pixel electrodes 4 and the source bus 2, and the pixel electrode 4 and the additional capacitor common line 8 were layered through the intermediate insulating layer 17. This arrangement allows the pixel electrode 4 to be formed by patterning without regard to the distance from the source bus 2 and the additional capacitor common line 8, thereby securing a display device with a relatively large numerical aperture. No leakage of light occurs between the pixel electrode 4 and the source bus 2, or between the pixel electrode 4 and the additional capacitor common line 8. It is therefore unnecessary to overlap light shield layers on these interface areas, thereby avoiding reducing the numerical aperture of the display panel. In the illustrated embodiment, the light shield layers are provided at the areas between the source bus 2 and the additional capacitor common line 8. The width of the light shield layer can be equal to the sum of the spacing between the source bus 2 and the additional capacitor common line 8 and the overlapping portions of the counter substrate and the active matrix substrate.

Figure 5:
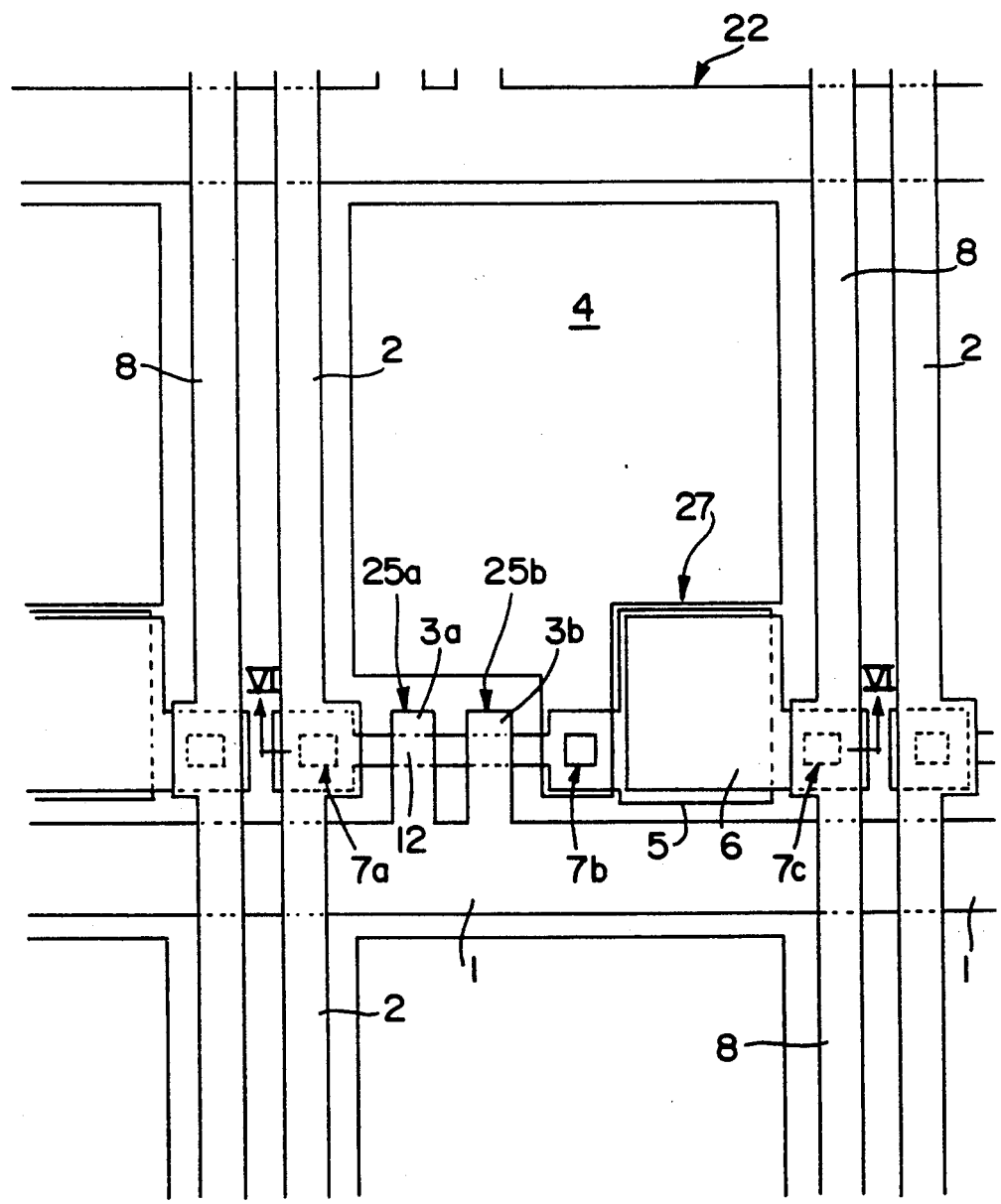
FIG. 5 is a partial plan view showing a TFT array used in the display device of FIG. 4.
Figure 6:
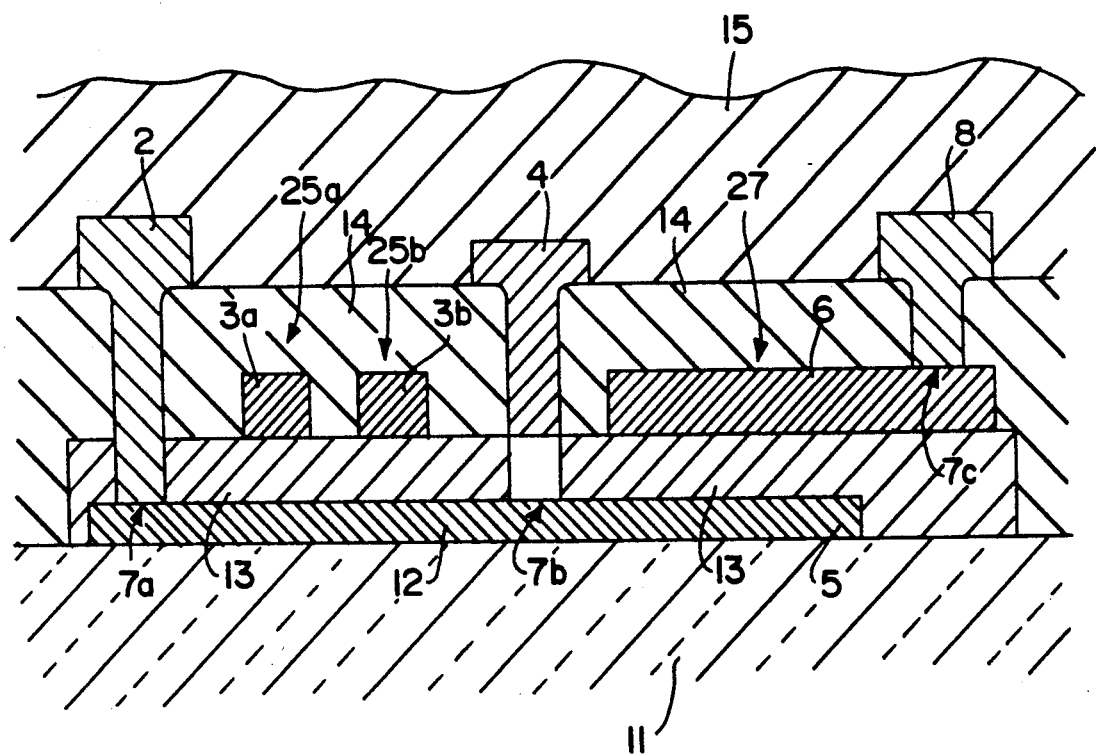
FIG. 6 is a cross-sectional view taken along the line VI—VI in FIG. 5.

The numerical aperture of the display panel illustrated in FIG. 1 was 48%, whereas that of the known display panel shown in FIG. 5 was 32%. This proves that the present invention achieves a larger numerical aperture of the display panel than that of the known display panel.

In the illustrated embodiment the spacing between the adjacent pixel electrodes 4 can be such a distance as to electrically isolate one from another. This distance is the minimum that allows the pixel electrodes to be formed by the process.

The illustrated embodiment allows the overlapping amounts of the pixel electrode 4 and the source bus 2, and the overlapping amounts of the pixel electrode 4 and the additional capacitor common line 8 to be equal to each other, but it is possible that the overlapping amounts of the pixel electrode 4 and the source bus 2 are larger than the overlapping amounts of the pixel electrode 4 and the additional capacitor common line 8. In the latter case, parasitic capacitance is minimized which otherwise would occur between the pixel electrode 4 and the source bus 2, thereby lessening variations in the potential of the pixel electrode 4. When the display device is operated with the maintenance of the constant potential of the counter electrode on the counter substrate, the same capacitance as that of the additional capacitor 27 is achievable as a parasitic capacitance between the pixel electrode 4 and the additional capacitor common line 8 because of the fact that the additional capacitor common line 8 is arranged so as to have the same potential as that of the counter electrode on the counter substrate. This parasite capacitance enhances the retention characteristic of an image signal applied to the pixel electrodes 4.

One pixel electrode 4 can be overlaid on the gate bus 1 connected to other pixel electrode located at one place before. This arrangement enlarges the area of the pixel electrode 4, thereby increasing the numerical aperture of the display panel. No leakage of light occurs between the pixel electrode 4 and the gate bus 1, thereby eliminating the necessity of overlaying a light shield layer over this area. Thus, the numerical aperture is protected from becoming reduced because of the overlapping edges of the light shield layers and the pixel electrodes 4. The gate bus 1 is kept "on" while image signals are applied to the pixel electrodes 4, and at other time it has the same potential as that of the counter electrode. As a result, a parasitic capacitance occurs which has the same function as the additional capacitor 27. This parasitic capacitance enhances the retention characteristic of image signals applied to the pixel electrode 4.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An active matrix display device comprising:
   an insulated substrate;
   a semiconductor layer covering the substrate;
   a first insulating layer covering the semiconductor layer;
   a gate electrode and a capacitor electrode formed on the first insulating layer;
   a second insulating layer covering the first insulating layer and the gate electrode and capacitor electrode formed on the first insulating layer;
   a signal line for carrying an image signal formed on the second insulating layer and extending through holes in the second insulating layer and the first insulating layer for connection to the semiconductor layer which covers the substrate;
   a third insulating layer covering the second insulating layer and the signal line formed on the second insulating layer; and
   a pixel electrode formed on the third insulating layer.

2. An active matrix display device comprising:
   an insulated substrate;
   a semiconductor layer covering the substrate;
   a first insulating layer covering the semiconductor layer;
   a gate electrode and a capacitor electrode formed on the first insulating layer;
   a second insulating layer covering the first insulating layer and the gate electrode and capacitor electrode formed on the first insulating layer;
   a signal line for carrying an image signal formed on the second insulating layer and extending through holes in the second insulating layer and the first insulating layer for connection to the semiconductor layer which covers the substrate;
   a third insulating layer covering the second insulating layer and the signal line formed on the second insulating layer;
   a pixel electrode formed on the third insulating layer, the pixel electrode being connected through holes in the first, second, and third insulating layers for connection to the semiconductor layer which covers the substrate.

3. An active matrix display device according to claims 2 or 1, wherein the insulated substrate comprises a stagger type thin film transistor including the semiconductor layer, the first insulating layer, and the gate electrode formed thereon, the thin film transistor having a source region connected to the signal line, and a drain region connected to the pixel electrode.

4. An active matrix display according to claims 2 or 1, wherein the pixel electrode extends over the third insulating layer so as to extend at least partially over the signal line formed beneath the third insulating layer.

5. An active matrix display according to claims 2 or 1, wherein the signal line is formed with a low resistance material.

6. An active matrix display according to claims 2 or 1, further comprising a common capacitor line formed on the second insulating layer and extending through a hole in the second insulating layer for connection to a capacitor electrode, the common capacitor line being covered by the third insulating layer.

7. An active matrix display according to claim 6, wherein the pixel electrode extends over the third insulating layer so as to extend at least partially over the common capacitor line formed beneath the third insulating layer.

* * * * *